(12) United States Patent
Kang et al.

(10) Patent No.: US 10,985,138 B2
(45) Date of Patent: Apr. 20, 2021

(54) SEMICONDUCTOR PACKAGE HAVING A PLURALITY OF CHIPS AND METHOD OF MANUFACTURING THE SAME

(71) Applicant: SAMSUNG ELECTRONICS CO., LTD., Suwon-si (KR)

(72) Inventors: SunWon Kang, Suwon-si (KR); Won-young Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/855,205

(22) Filed: Dec. 27, 2017

(65) Prior Publication Data

US 2018/0358328 A1 Dec. 13, 2018

(30) Foreign Application Priority Data

Jun. 7, 2017 (KR) .................. 10-2017-0070933

(51) Int. Cl.
| | |
|---|---|
| H01L 25/065 | (2006.01) |
| H01L 23/00 | (2006.01) |
| H01L 23/498 | (2006.01) |
| H01L 23/522 | (2006.01) |
| H01L 25/00 | (2006.01) |

(Continued)

(52) U.S. Cl.
CPC ........ *H01L 25/0657* (2013.01); *H01L 21/568* (2013.01); *H01L 21/6835* (2013.01); *H01L 23/49822* (2013.01); *H01L 23/5226* (2013.01); *H01L 24/05* (2013.01); *H01L 24/19* (2013.01); *H01L 24/20* (2013.01); *H01L 24/97* (2013.01); *H01L 25/105* (2013.01); *H01L 25/50* (2013.01); *H01L 21/561* (2013.01); *H01L 23/3128* (2013.01); *H01L 2221/68345* (2013.01); *H01L 2221/68359* (2013.01); *H01L 2224/12105* (2013.01); *H01L 2224/18* (2013.01); *H01L 2224/73267* (2013.01); *H01L 2224/97* (2013.01); *H01L 2225/06541* (2013.01); *H01L 2225/06572* (2013.01); *H01L 2225/1035* (2013.01)

(58) Field of Classification Search
CPC ............ H01L 23/5226; H01L 23/5389; H01L 23/5384; H01L 25/0657; H01L 25/117; H01L 25/074

See application file for complete search history.

(56) References Cited

U.S. PATENT DOCUMENTS

| | | |
|---|---|---|
| 8,232,657 B2 | 7/2012 | Boon et al. |
| 8,736,065 B2 | 5/2014 | Gonzalez et al. |

(Continued)

*Primary Examiner* — Laura M Menz
*Assistant Examiner* — Candice Chan
(74) *Attorney, Agent, or Firm* — Lee IP Law, P.C.

(57) ABSTRACT

A semiconductor package includes a first interconnect substrate on a first redistribution substrate and having a first opening penetrating the first interconnect substrate. A first semiconductor chip is on the first redistribution substrate and the first opening of the first interconnect substrate. A second redistribution substrate is on the first interconnect substrate and the first semiconductor chip. A second interconnect substrate is on the second redistribution substrate and has a second opening penetrating the second interconnect substrate. A second semiconductor chip is on the second redistribution substrate and in the second opening of the second interconnect substrate.

16 Claims, 9 Drawing Sheets

(51) Int. Cl.
  *H01L 21/56*     (2006.01)
  *H01L 21/683*    (2006.01)
  *H01L 25/10*     (2006.01)
  *H01L 23/31*     (2006.01)

(56) References Cited

U.S. PATENT DOCUMENTS

| | | | |
|---|---|---|---|
| 8,878,360 B2 | 11/2014 | Meyer et al. | |
| 9,601,471 B2 | 3/2017 | Zhai | |
| 9,613,931 B2 | 4/2017 | Lin | |
| 9,633,974 B2* | 4/2017 | Zhai | H01L 23/3135 |
| 9,698,104 B2 | 7/2017 | Yap et al. | |
| 9,893,045 B2* | 2/2018 | Pagaila | H01L 21/56 |
| 2016/0343685 A1* | 11/2016 | Lin | H01L 21/561 |
| 2018/0233457 A1* | 8/2018 | Chen | H01L 23/552 |

* cited by examiner

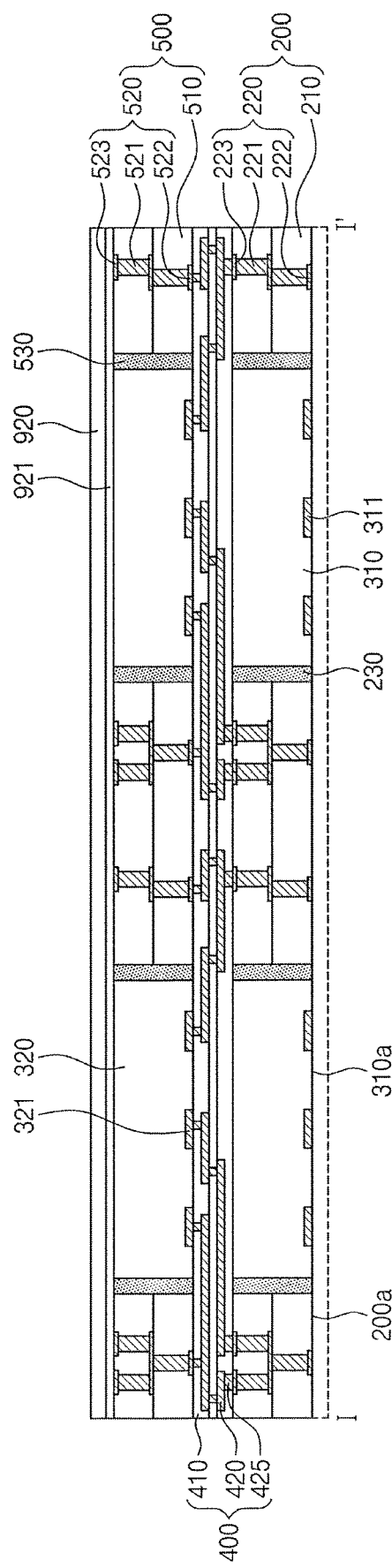
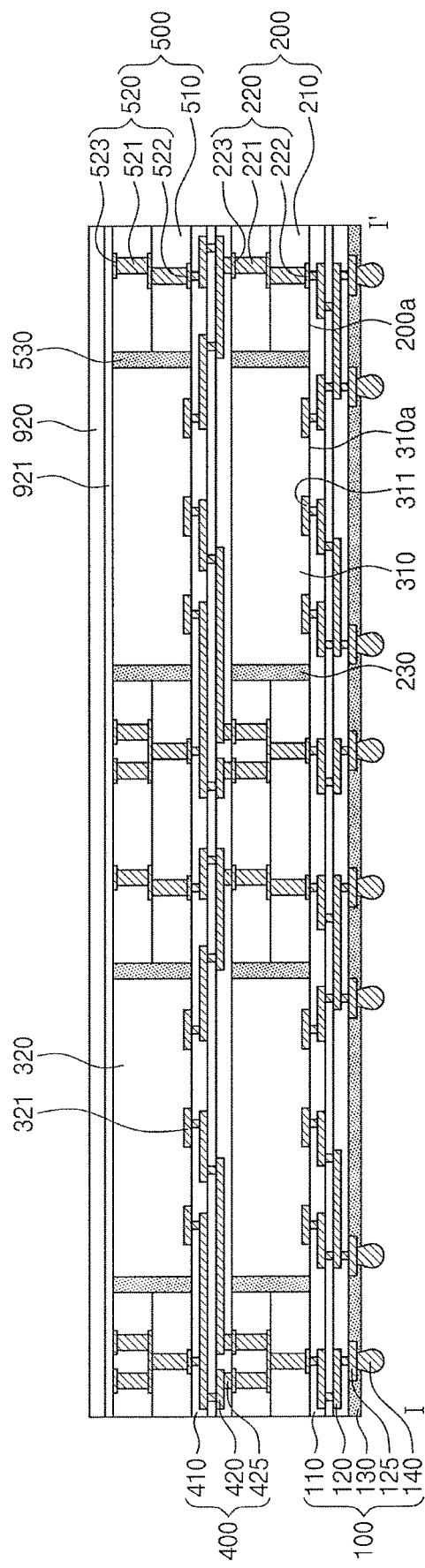

SEMICONDUCTOR PACKAGE HAVING A PLURALITY OF CHIPS AND METHOD OF MANUFACTURING THE SAME

CROSS-REFERENCE TO RELATED APPLICATIONS

This U.S. non-provisional patent application claims priority under 35 U.S.C § 119 of Korean Patent Application No. 10-2017-0070933, filed on Jun. 7, 2017, the entire contents of which are hereby incorporated by reference.

FIELD

One or more embodiments described herein relate to a semiconductor package and a method for manufacturing a semiconductor package.

BACKGROUND

A semiconductor package is provided to implement an integrated circuit chip for use in electronic products. In one type of semiconductor package, a semiconductor chip is mounted on a printed circuit board, and bonding wires or bumps are used to electrically connect the semiconductor chip to the printed circuit board.

Attempts are continually being made to reduce the size, weight, and cost of manufacturing semiconductor packages. The sizes of semiconductor chips in the packages may be made smaller as integration increases. However, it may be difficult to adhere, handle, and/or test solder balls of a semiconductor chip of reduced size. Additionally, there are problems of acquiring a diversified mount board in accordance with the size of the semiconductor chip.

SUMMARY

In accordance with one or more embodiments, a semiconductor package includes a first redistribution substrate; a first interconnect substrate on the first redistribution substrate and having a first opening penetrating the first interconnect substrate; a first semiconductor chip on the first redistribution substrate and in the first opening of the first interconnect substrate; a second redistribution substrate on the first interconnect substrate and the first semiconductor chip; a second interconnect substrate on the second redistribution substrate and having a second opening penetrating the second interconnect substrate; and a second semiconductor chip on the second redistribution substrate and in the second opening of the second interconnect substrate.

In accordance with one or more other embodiments, a method for manufacturing a semiconductor package includes forming a first opening in and penetrating a first interconnect substrate; providing a first carrier substrate on a bottom surface of the first interconnect substrate; providing a first semiconductor chip in the first opening; removing the first carrier substrate to expose a bottom surface of the first semiconductor chip and the bottom surface of the first interconnect substrate; forming a first redistribution substrate on the bottom surface of the first semiconductor chip and the bottom surface of the first interconnect substrate; forming a second opening in a second interconnect substrate, the second opening penetrating the second interconnect substrate; providing a second carrier substrate on a bottom surface of the second interconnect substrate; providing a second semiconductor chip in the second opening; adhering the second interconnect substrate onto a bottom surface of the first redistribution substrate; removing the second carrier substrate to expose a bottom surface of the second semiconductor chip and the bottom surface of the second interconnect substrate; and forming a second redistribution substrate on the bottom surface of the second semiconductor chip and the bottom surface of the second interconnect substrate.

In accordance with one or more other embodiments, a semiconductor package, comprising: a first substrate; a first semiconductor chip on the first substrate; a first interconnect substrate on the first substrate and laterally spaced apart from the first semiconductor chip, the first semiconductor chip surrounded by the first interconnect substrate in a plan view; a second substrate electrically connected to the first interconnect substrate and covering the first interconnect substrate and the first semiconductor chip; a second semiconductor chip on the second substrate; and a second interconnect substrate on the second substrate and laterally spaced apart from the second semiconductor chip, the second semiconductor chip surrounded by the second interconnect substrate, in a plan view, wherein each of the first and second interconnect substrates comprises a base layer and a conductive member in the base layer.

BRIEF DESCRIPTION OF THE DRAWINGS

FIGS. 6A to 6K illustrates various stages of the method for manufacturing a semiconductor package.

DETAILED DESCRIPTION OF EMBODIMENTS

Figure 1:
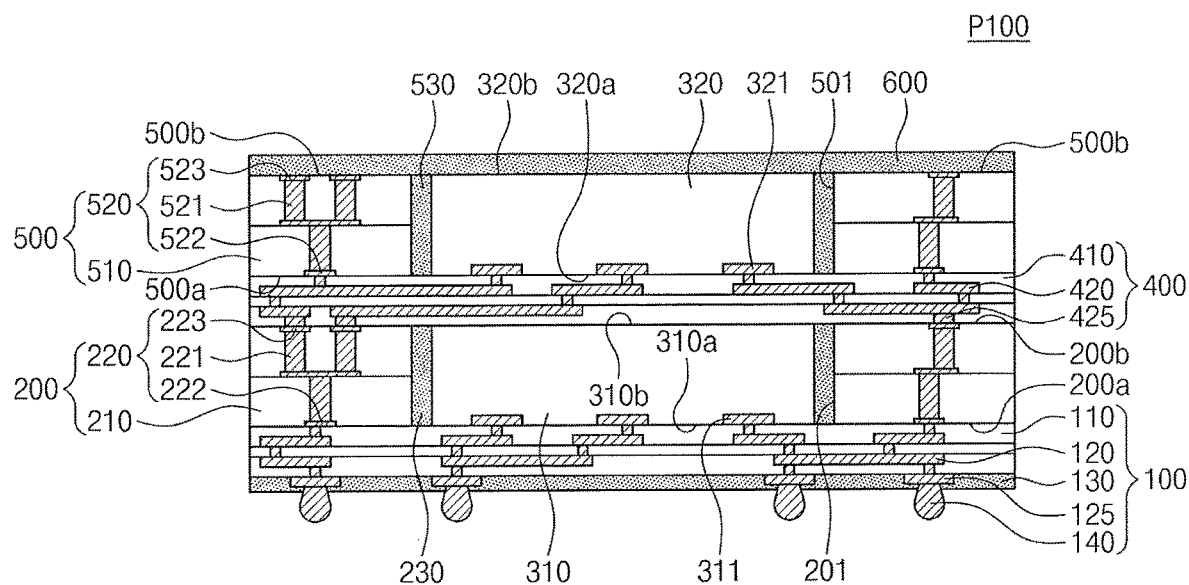
FIG. 1 illustrates an embodiment of a semiconductor package.
Figure 2:
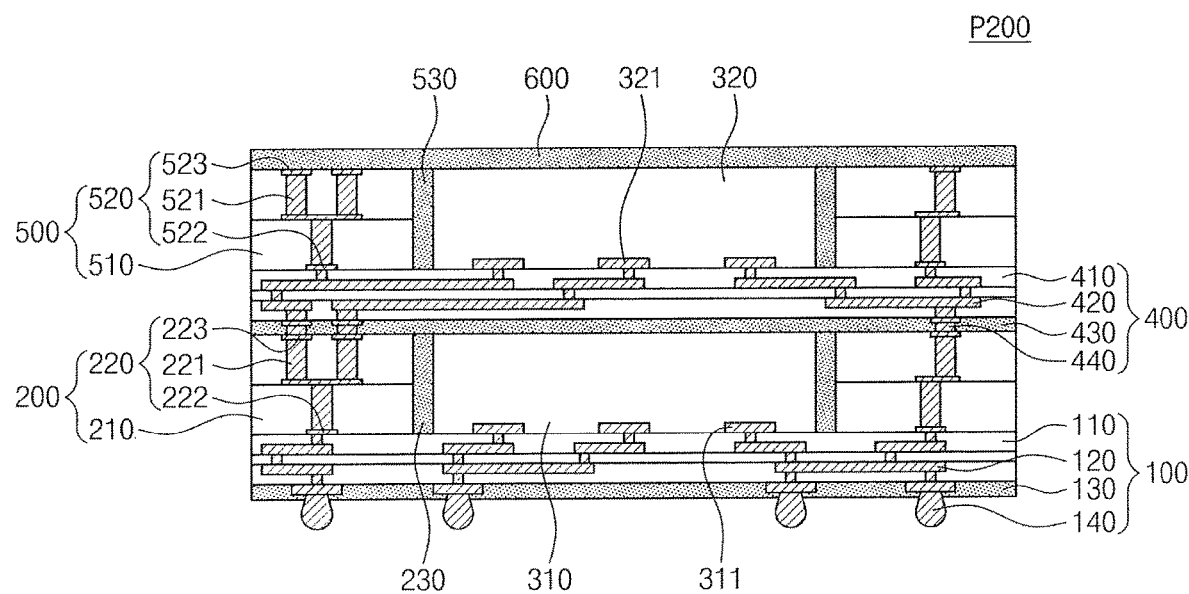
FIG. 2 illustrates another embodiment of a semiconductor package.
Figure 3:
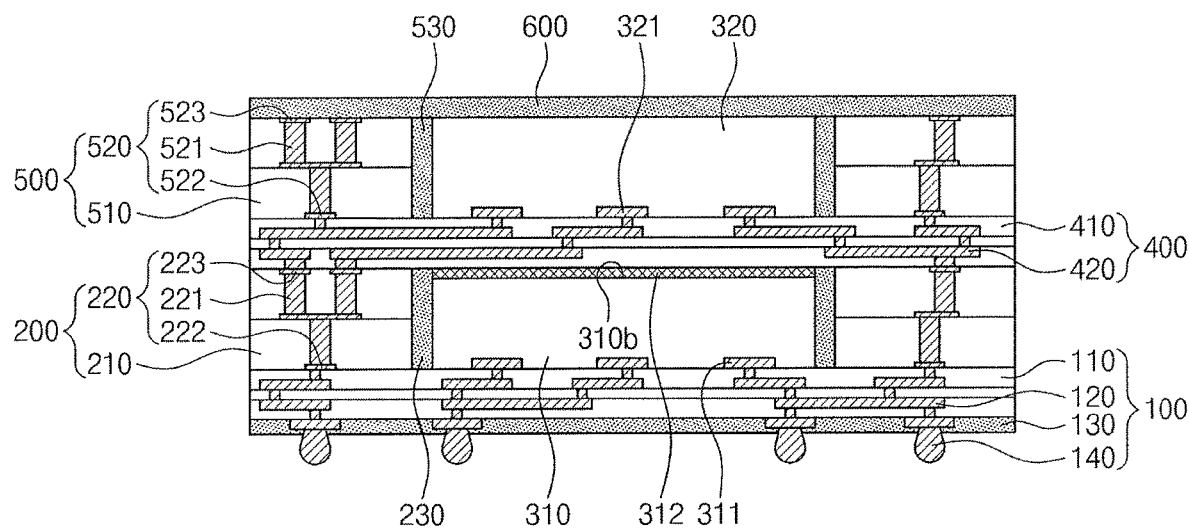
FIG. 3 illustrates another embodiment of a semiconductor package.

FIGS. 1, 2, and 3 illustrate cross-sectional views of various embodiments of a semiconductor package. Referring to FIG. 1, a semiconductor package P100 includes a first substrate 100 which, for example, may be a redistribution substrate. The first substrate 100 may include first insulating patterns 110 and first conductive patterns 120. The first conductive patterns 120 may include one or more conductive layers between the first insulating patterns 110 and one or more vias penetrating the first insulating patterns 110.

The first insulating patterns 110 may include an inorganic insulating layer such as silicon oxide or silicon nitride. In one embodiment, the first insulating patterns 110 may include a polymer material. The first conductive patterns 120 may be surrounded by or adjacent to the first insulating patterns 110. The first conductive patterns 120 may redistribute a first semiconductor chip 310 mounted on the first substrate 100.

The semiconductor package P100 may have a fan-out structure by the first substrate 100. The first conductive patterns 120 may include metal and may be connected to first pads 125 on a bottom surface of the first substrate 100. A first protective layer 130 may be on the bottom surface of the first substrate 100 and may include, for example, an inorganic material, an organic material, an ABF (Ajinomoto Build-up Film), or an insulating polymer such as an epoxy-based polymer. External terminals 140 may be attached to the bottom surface of the first substrate 100 and may be disposed on the first pads 125. The external terminals 140 may be electrically connected through the first pads 125 to the first conductive patterns 120.

A first interconnect substrate 200 may be on the first substrate 100 and may include a first opening 201 penetrating therethrough. For example, the first opening 201 may have an open hole shape that connects the bottom surface 200a of the first interconnect substrate 200 to the top surface 200b of the first interconnect substrate 200. The bottom surface 200a of the first interconnect substrate 200 may be in contact with a top surface of the first substrate 100. The first interconnect substrate 200 may include a first conductive member 220 in a first base layer 210. The first base layer 210 may include, for example, silicon oxide. The first opening 201 may occupy an inner side of the first interconnect substrate 200, and the first conductive member 220 may occupy an outer side of the first interconnect substrate 200.

The first conductive member 220 may include first lower pads 222, first through vias 221, and first upper pads 223. The first lower pads 222 may be disposed in a lower portion of the first interconnect substrate 200. The first lower pads 222 may not protrude beyond the bottom surface of the first base layer 210, e.g., the first lower pads 222 may be embedded in the first interconnect substrate 200. The first lower pads 222 may be mechanically coupled and electrically connected to the first conductive patterns 120. The first upper pads 223 may be in an upper portion of the first interconnect substrate 200. The first upper pads 223 may not protrude beyond a top surface of the first base layer 210, e.g., the first upper pads 223 may be embedded in the first interconnect substrate 200. The number of the first upper pads 223 may be different from the number of the external terminals 140. The first through vias 221 may penetrate the first base layer 210 and electrically connect the first lower pads 222 to the first upper pads 223.

The first semiconductor chip 310 may be on the first substrate 100 and may reside in the first opening 201 of the first interconnect substrate 200. In a plan view, the first semiconductor chip 310 may have a planar shape smaller than that of the first opening 201. For example, the first semiconductor chip 310 may be spaced apart from an inner wall of the first opening 201. The first semiconductor chip 310 may have a bottom surface 310a facing the first substrate 100 and a top surface 310b opposite the bottom surface 310a. The bottom surface 310a of the first semiconductor chip 310 may be an active surface. The bottom surface 310a of the first semiconductor chip 310 may be in contact with the top surface of the first substrate 100. In this configuration, the bottom surface 310a of the first semiconductor chip 310 may be at the same level as that of the bottom surface 200a of the first interconnect substrate 200. The top surface 310b of the first semiconductor chip 310 may be at the same or a lower level than the top surface 200b of the first interconnect substrate 200.

The first semiconductor chip 310 has a lower portion which includes first chip pads 311. The first chip pads 311 may be electrically connected to the first conductive patterns 120 of the first substrate 100. The first semiconductor chip 310 may be, for example, a memory chip or an application processor (AP) chip. In one embodiment, a plurality of first semiconductor chips 310 may reside in the first opening 201. For example, the plurality of first semiconductor chips 310 may be placed side-by-side on the first substrate 100. In this case, the plurality of first semiconductor chips 310 may be spaced apart from each other.

A first insulating layer 230 may be on the first substrate 100 and may be located in (or fill) an area between the first interconnect substrate 200 and the first semiconductor chip 310. The first insulating layer 230 may have a lowermost bottom surface in contact with the top surface of the first substrate 100. The lowermost bottom surface of the first insulating layer 230 may be at the same level as that of the bottom surface 200a of the first interconnect substrate 200. The first insulating layer 230 may include, for example, an insulating polymer, a thermosetting resin, or an ABF.

A second substrate 400 may be on the first interconnect substrate 200 and, for example, may cover the top surface 200b of the first interconnect substrate 200 and the top surface 310b of the first semiconductor chip 310. The second substrate 400 may be a redistribution substrate. For example, the second substrate 400 may include second insulating patterns 410 and second conductive patterns 420. The second insulating patterns 410 may include, for example, silicon oxide. The second conductive patterns 420 may include one or more conductive layers between the second insulating patterns 410 and one or more vias penetrating the second insulating patterns 410. The second conductive patterns 420 may be connected to second pads 425 in a lower portion of the second substrate 400. The second pads 425 may be exposed from a bottom surface of the second substrate 400.

In a plan view, the second pads 425 may not overlap the first semiconductor chip 310. For example, the second substrate 400 may be electrically connected to the first semiconductor chip 310 and the first substrate 100 through the first interconnect substrate 200 connected to the second pads 425. Thus, the second pads 425 may be on the top surface 200b of the first interconnect substrate 200 and outside the first semiconductor chip 310. The second pads 425 may be coupled to the first upper pads 223 of the first interconnect substrate 200.

The second conductive patterns 420 may redistribute a second semiconductor chip 320 mounted on the second substrate 400. The second conductive patterns 420 may be electrically connected through the second pads 425 to the first upper pads 223 of the first interconnect substrate 200. In a plan view, the second pads 425 may be more densely distributed than the external terminals 140. The second conductive patterns 420 may include metal. In FIG. 1, the second pads 425 of the second substrate 400 are directly connected to first upper pads 223.

FIG. 2 illustrates another embodiment of a semiconductor package P200. As illustrated in FIG. 2, the second substrate 400 may further include a second protective layer 430 and one or more interconnect terminals 440. The second protective layer 430 may include an ABF or an insulating polymer such as an epoxy-based polymer. The second protective layer 430 may be on the bottom surface of the second substrate 400. The interconnect terminals 440 may be between the second conductive patterns 420 and the first upper pads 223, to electrically connect the second conductive patterns 420 to the first upper pads 223. The semiconductor package P200 may be substantially the same as the semiconductor package P100 of FIG. 1, except for the second substrate 400.

FIG. 3 illustrates another embodiment of a semiconductor package P300. As illustrated in FIG. 3, a glue layer 312 may further be included between the second substrate 400 and the top surface 310b of the first semiconductor chip 310. The glue layer 312 may include, for example, silicon resin. In one embodiment, in order to enhance heat radiation, the glue layer 312 may include a thermal interface material (TIM)

such as thermal grease. The second substrate 400 may be rigidly adhered through the glue layer 312 to the first semiconductor chip 310. The glue layer 312 may include an insulating material The glue layer 312 may insulate the first semiconductor chip 310 from the second substrate 400. The semiconductor package P300 may be substantially the same as the semiconductor package P100 of FIG. 1, except from the glue layer 312 described above.

Referring back to FIG. 1, a second interconnect substrate 500 may be on the second substrate 400 and may include a second opening 501 penetrating therethrough. FIG. 1 illustrates that the second opening 501 of the second interconnect substrate 500 vertically overlaps the first opening 201 of the first interconnect substrate 200. In one embodiment, the second interconnect substrate 500 may have a bottom surface 500a in contact with a top surface of the second substrate 400.

The second interconnect substrate 500 may include a second base layer 510 and a second conductive member 520 in the second base layer 510. The second base layer 510 may include, for example, silicon oxide. The second opening 501 may occupy an inner side of the second interconnect substrate 500, and the second conducive member 520 may occupy an outer side of the second interconnect substrate 500.

The second conductive member 520 may include second lower pads 522, second through vias 521, and second upper pads 523. The second lower pads 522 may be in a lower portion of the second interconnect substrate 500. The second lower pads 522 may be mechanically coupled and electrically connected to the second conductive patterns 420 of the second substrate 400. The second upper pads 523 may be in an upper portion of the second interconnect substrate 500. The second through vias 521 may penetrate the second base layer 510 and electrically connect the second lower pads 522 to the second upper pads 523.

A second semiconductor chip 320 may be on the second substrate 400 and may reside in the second opening 501 of the second interconnect substrate 500. In a plan view, the second semiconductor chip 320 may have a planar shape smaller than that of the second opening 501. For example, the second semiconductor chip 320 may be spaced apart from an inner wall of the second opening 501.

The second semiconductor chip 320 may have a bottom surface 320a facing the second substrate 400 and a top surface 320b opposite the bottom surface 320a. The bottom surface 320a of the second semiconductor chip 320 may be an active surface. The bottom surface 320a of the second semiconductor chip 320 may be in contact with the top surface of the second substrate 400. In this configuration, the bottom surface 320a of the second semiconductor chip 320 may be at the same level as that of the bottom surface 500a of the second interconnect substrate 500.

The second semiconductor chip 320 may include second chip pads 321 in a lower portion thereof. The second chip pads 321 may be electrically connected to the second conductive patterns 420 of the second substrate 400. The second semiconductor chip 320 may be, for example, a memory chip or an application processor chip. In other embodiment, a plurality of second semiconductor chips 320 may reside in the second opening 501.

A second insulating layer 530 may be on the second substrate 400 and may be located in (or fill) an area between the second interconnect substrate 500 and the second semiconductor chip 320. The second insulating layer 530 may have a lowermost bottom surface in contact with the top surface of the second substrate 400. The lowermost bottom surface of the second insulating layer 530 may be at the same level as that of the bottom surface 500a of the second interconnect substrate 500. The second insulating layer 530 may include an insulating polymer, a thermosetting resin, or an ABF.

A molding layer 600 may be on the second substrate 400. For example, the molding layer 600 may cover the top surface 500b of the second interconnect substrate 500 and the top surface 320b of the second semiconductor chip 320. The molding layer 600 may include, for example, an insulating polymer such as an epoxy-based polymer or a high molecular material such as a thermosetting resin. In other embodiments, the second upper pads 523 of the second interconnect substrate 500 may be exposed to an opening in the molding layer 600.

The semiconductor packages P100 to P300 of the aforementioned embodiments may have a structure in which a plurality of fan-out panel level packages (FO-PLP) is stacked. The semiconductor packages P100 to P300 may not require separate interconnect terminals to electrically connect the stacked semiconductor chips 310 and 320 to each other, and instead may utilize the plate-shaped substrates 200 and 500 and the conductive members 220 and 520 (which are outside the semiconductor chips 310 and 320) to electrically connect the stacked semiconductor chips 310 and 320 to each other.

Accordingly, each of the semiconductor packages P100 to P300 includes a plurality of the stacked semiconductor chips 310 and 320 and may have reduced thickness and size. It therefore may be possible to enhance integration of devices, each of which includes at least one of the semiconductor packages P100 to P300. In addition, an electrical path may be reduced between the semiconductor chips 310 and 320, and thereby the semiconductor packages P100 to P300 may have excellent electrical characteristics.

The semiconductor packages P100 to P300 of the aforementioned embodiments may have a multi-stack structure in which three or more semiconductor chips are stacked. For example, the semiconductor packages P100 to P300 may further include a third semiconductor chip stacked on the second semiconductor chip 320.

Figure 4:
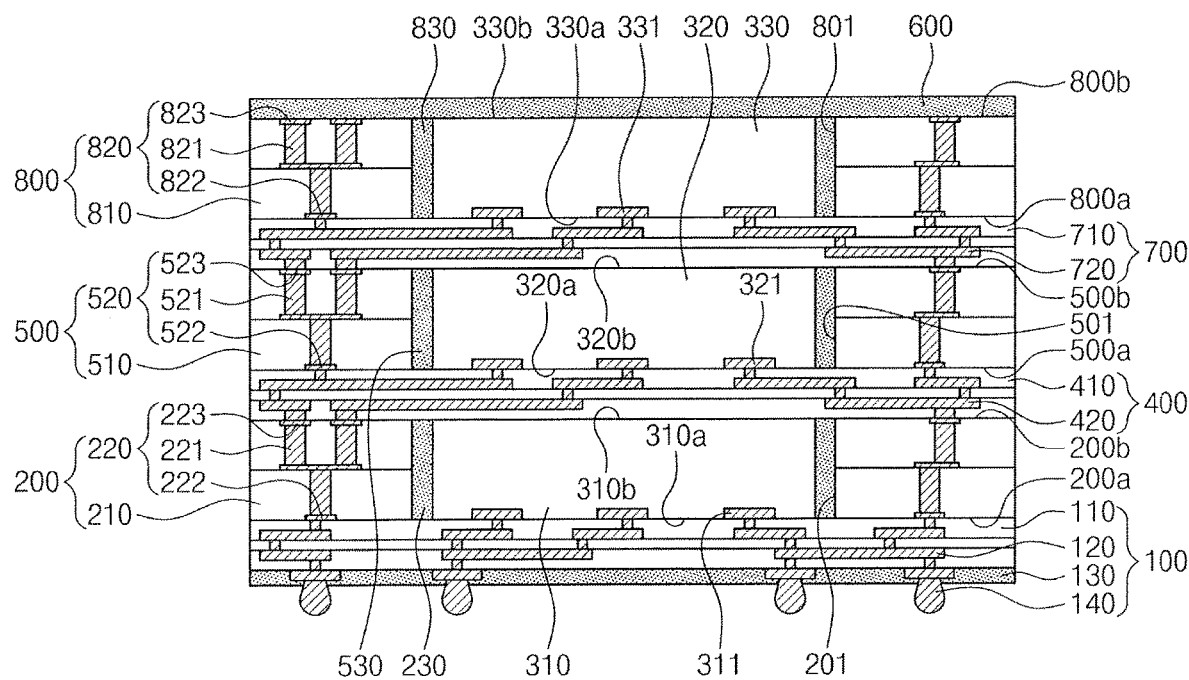
FIG. 4 illustrates another embodiment of a semiconductor package.

FIG. 4 illustrates a cross-sectional of another embodiment of a semiconductor package P400 which may include a third substrate 700, a third interconnect substrate 800, and a third semiconductor chip 330, all of which are between the second interconnect substrate 500 and the molding layer 600. The third substrate 700 and the third interconnect substrate 800 may be configured substantially the same as the second substrate 400 and the second interconnect substrate 500, respectively. The semiconductor package P400 may be substantially the same as at least one of the semiconductor packages P100 to P300 discussed with reference to FIGS. 1 to 3, except of the aforementioned description.

Figure 5:
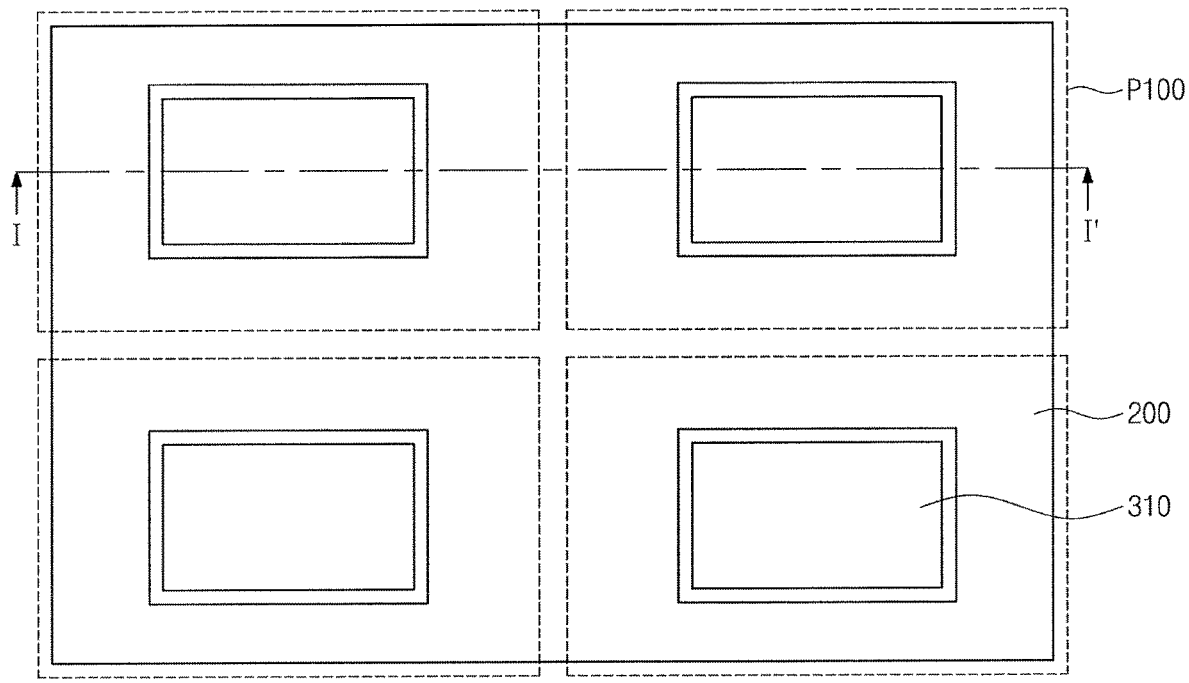
FIG. 5 illustrates an embodiment of a method for manufacturing a semiconductor package.

FIG. 5 illustrates an embodiment of a method for manufacturing a semiconductor package, which, for example, may correspond to any of the aforementioned embodiments. FIGS. 6A to 6K are cross-sectional views illustrating various stages of the method for manufacturing a semiconductor package according to exemplary embodiments. FIGS. 6A to 6K correspond to cross-sectional views taken along line I-I' in FIG. 5.

Figure 6A:
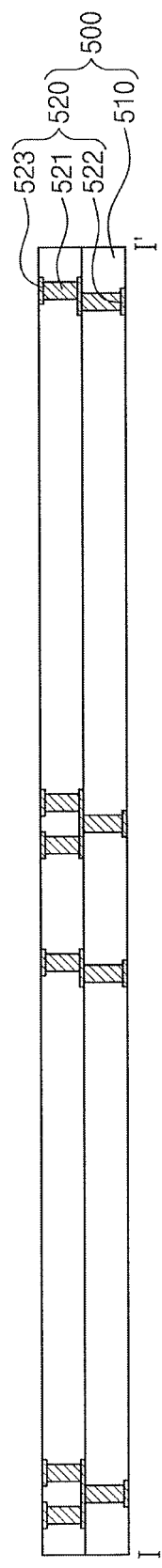

Referring to FIGS. 5 and 6A, a second interconnect substrate 500 includes a second conductive member 520 in a second base layer 510. The second conductive member 520 may include second lower pads 522, second through vias 521, and second upper pads 523. For example, the second base layer 510 may be etched and its inside may be filled with a conductive material to form the second through vias 521, the second lower pads 522, and the second upper pads 523.

Figure 6B:
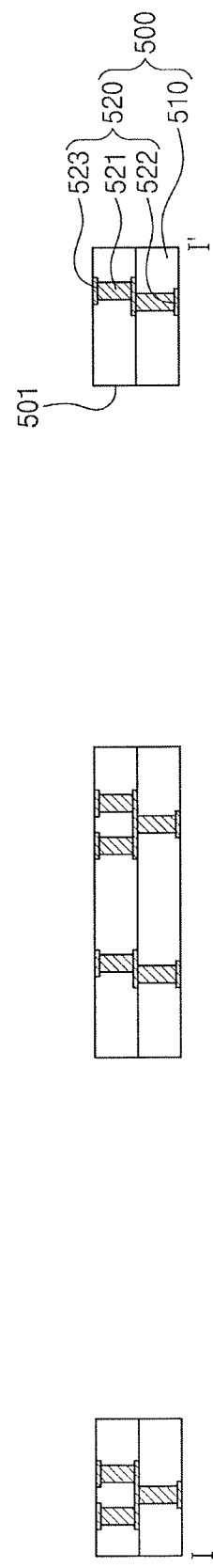

Referring to FIGS. 5 and 6B, a second opening 501 may be formed in the second interconnect substrate 500. A portion of the second interconnect substrate 500 may be removed to form the second opening 501 penetrating therethrough. The second opening 501 may be formed, for example, by an etching process such as drilling, laser ablation, or laser cutting. The removed portion of the second interconnect substrate 500 may be a zone in which a second semiconductor chip 320 is provided in a subsequent process.

Figure 6C:
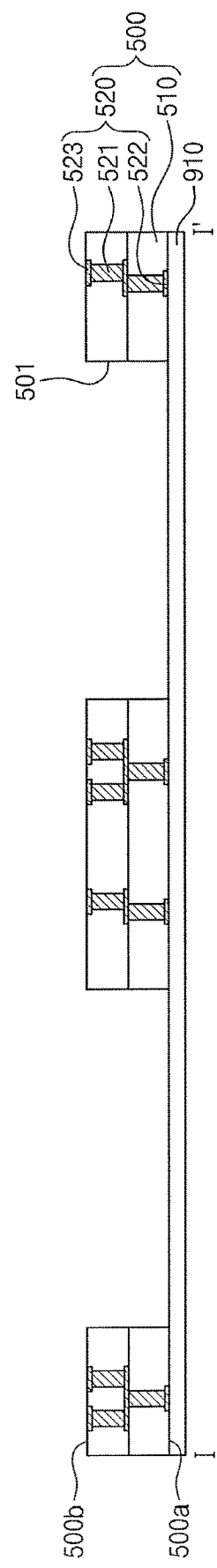

Referring to FIGS. 5 and 6C, the second interconnect substrate 500 may be attached onto a first carrier substrate 910. The first carrier substrate 910 may be, for example, an insulating substrate including glass or polymer or a conductive substrate including metal.

The first carrier substrate 910 may have a top surface which includes an adhesive member used to adhere the first carrier substrate 910 to a bottom surface 500a of the second interconnect substrate 500. The adhesive member may include, for example, glue tape.

Figure 6D:
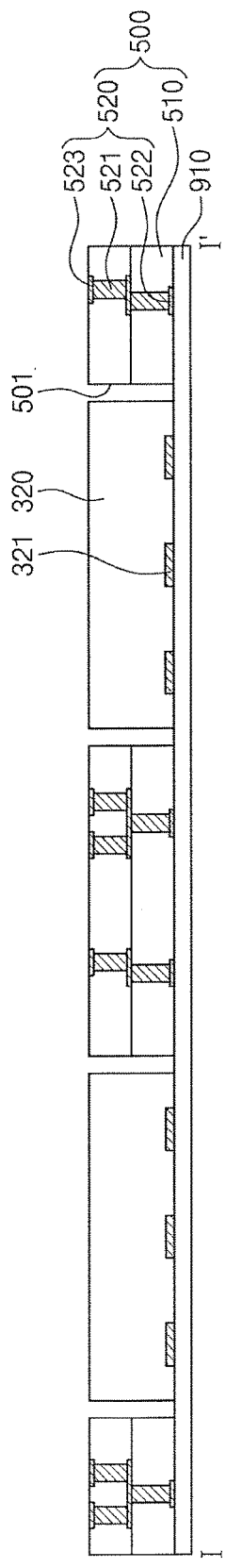

Referring to FIGS. 5 and 6D, a second semiconductor chip 320 may be on the first carrier substrate 910 and in the second opening 501 of second interconnect substrate 500. At this stage, the second semiconductor chip 320 may be adhered to the first carrier substrate 910. The second semiconductor chip 320 may have a lower portion with second chip pads 321.

Figure 6E:
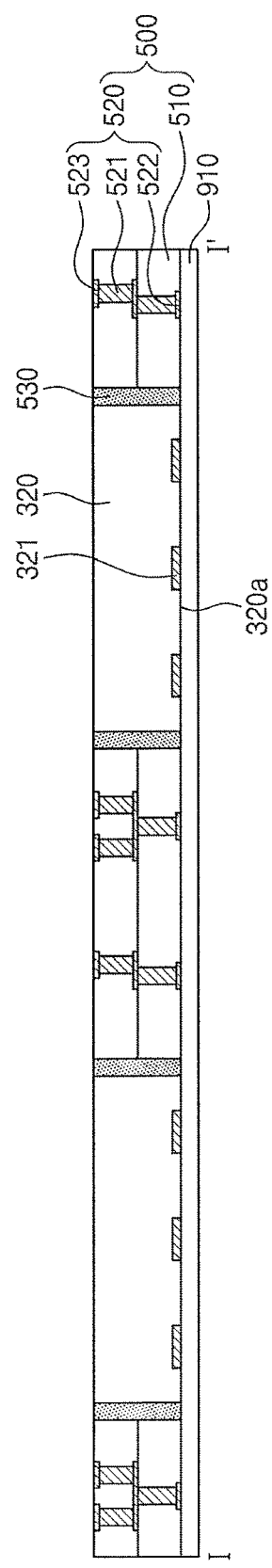

Referring to FIGS. 5 and 6E, a second insulating layer 530 may be formed on the first carrier substrate 910 and may be located (or fill) an area between the second interconnect substrate 500 and the second semiconductor chip 320. For example, an insulating material may be injected between the second interconnect substrate 500 and the second semiconductor chip 320, and then cured to form the second insulating layer 530. The insulating material may include, for example, an insulating polymer or a thermosetting resin.

Figure 6F:
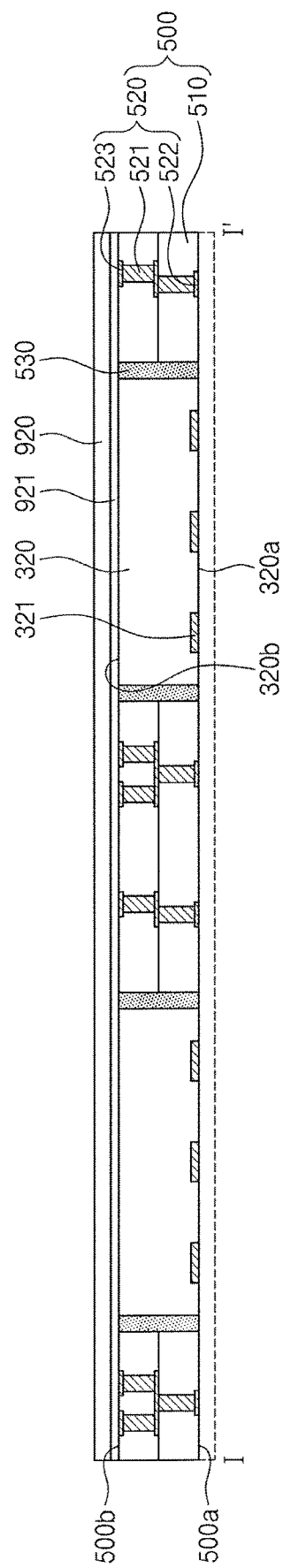

Referring to FIGS. 5 and 6F, a support substrate 920 may be provided on the second interconnect substrate 500. The support substrate 920 may be, for example, an insulating substrate such as glass substrate. A carrier glue layer 921 may be used to adhere the support substrate 920 to a top surface 500b of the second interconnect substrate 500 and a top surface 320b of the second semiconductor chip 320. The carrier glue layer 921 may a resin film.

The first carrier substrate 910 may be removed. The first carrier substrate 910 may be removed as designated by a dotted line, to thereby expose the bottom surface 500a of the second interconnect substrate 200 and a bottom surface 320a of the second semiconductor chip 320. The first carrier substrate 910 may be removed by applying a shear stress or by chemically treating the adhesive member discussed with reference to FIGS. 5 and 6C.

Figure 6G:
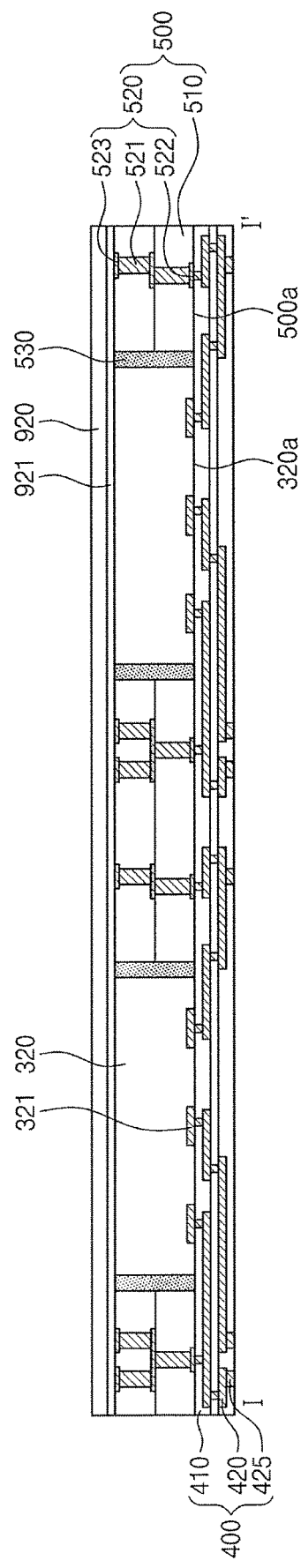

Referring to FIGS. 5 and 6G, a second substrate 400 may be formed on the bottom surface 320a of the second semiconductor chip 320 and the bottom surface 500a of the second interconnect substrate 500. For example, second insulating patterns 410, second conductive patterns 420, and second pads 425 may be foamed on the bottom surface 320a of the second semiconductor chip 320 and the bottom surface 500a of the second interconnect substrate 500. As a result, the second substrate 400 may be fabricated.

An insulating layer (e.g., a silicon oxide layer) may be formed on the bottom surface 320a of the second semiconductor chip 320 and the bottom surface 500a of the second interconnect substrate 500, and then patterned to form a portion of a second insulating pattern 410. The second chip pad 321 and the second lower pad 522 may be exposed through the second insulating pattern 410. A conductive layer may be formed on a bottom surface of the second insulating pattern 410, and then patterned to form the second conductive patterns 420 and the second pads 425. The second conductive pattern 420 may be electrically connected to one of the second chip pad 321 of the second semiconductor chip 320 and the second lower pad 522 of the second interconnect substrate 500. An insulating layer may be formed on bottom surfaces of the second conductive patterns 420 and then patterned to form other portion of the second insulating pattern 410. At this stage, the second pads 425 may be exposed through the second insulating pattern 410.

Figure 6H:
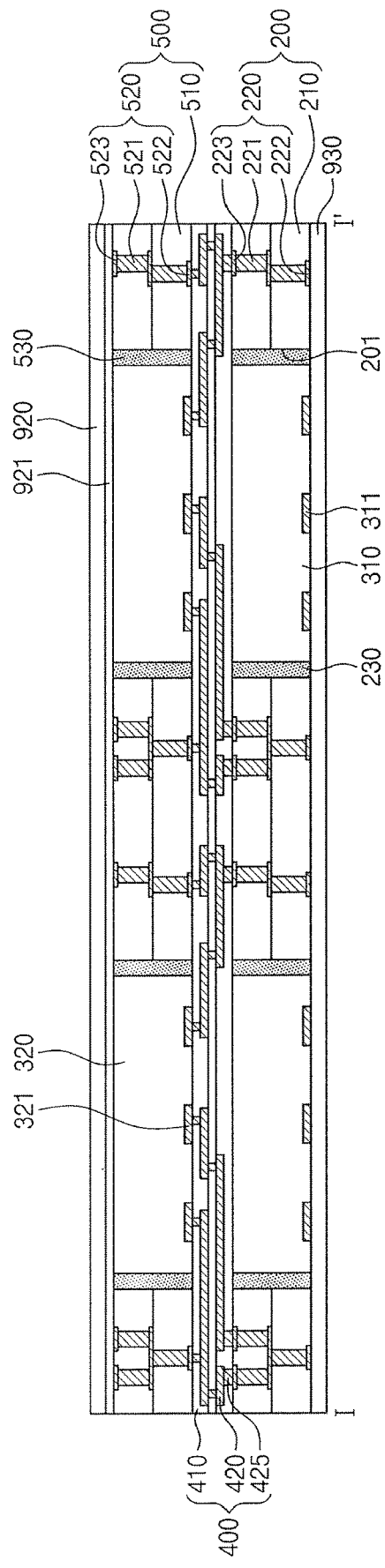

Referring to FIGS. 5 and 6H, a first interconnect substrate 200 and a first semiconductor chip 310 may be provided on a bottom surface of the second substrate 400, for example, in the same manner as discussed with reference to FIGS. 6A to 6E. For example, a first opening 201 may be formed in the first interconnect substrate 200. The first interconnect substrate 200 may be adhered onto a second carrier substrate 930. The first semiconductor chip 310 may be provided on the second carrier substrate 930. The first semiconductor chip 310 may be positioned in the first opening 201 of the first interconnect substrate 200. A first insulating layer 230 may be provided to fill an area between the first interconnect substrate 200 and the first semiconductor chip 310. Thereafter, the first interconnect substrate 200 may be adhered onto the bottom surface of the second substrate 400. At this stage, first upper pads 223 of the first interconnect substrate 200 may be mechanically coupled and electrically connected to the second pads 425 of the second substrate 400.

Referring to FIGS. 5 and 6I, the second carrier substrate 930 may be removed, for example, by applying a shear stress or by chemically treating an adhesive layer between the second carrier substrate 930 and the second substrate 400. The second carrier substrate 930 may be removed as designated by a dotted line, to thereby expose a bottom surface 200a of the first interconnect substrate 200 and a bottom surface 310a of the first semiconductor chip 310.

Referring to FIGS. 5 and 6J, a first substrate 100 may be formed beneath the first semiconductor chip 310 and the first interconnect substrate 200. First insulating patterns 110, first conductive patterns 120, and first pads 125 may be formed on the bottom surface 310a of the first semiconductor chip 310 and the bottom surface 200a of the first interconnect substrate 200. As a result, the first substrate 100 may be fabricated. The first substrate 100 may be formed, for example, by a redistribution layer (RDL) process, a damascene process, a dual damascene process, or a back end of line (BEOL) process.

The first conductive pattern 120 may be coupled to first chip pads 311 of the first semiconductor chip 310 and first lower pads 222 of the first interconnect substrate 200. A first protective layer 130 may be formed on a bottom surface of the first substrate 100. The first protective layer 130 may be patterned to expose the first pads 125. External terminals 140 may be formed on the exposed first pads 125 and electrically connected to the first upper pads 223 through the first conductive patterns 120 of the first substrate 100, the first lower pads 222 of the first interconnect substrate 200, and first through vias 221 of the first interconnect substrate 200.

Figure 6K:
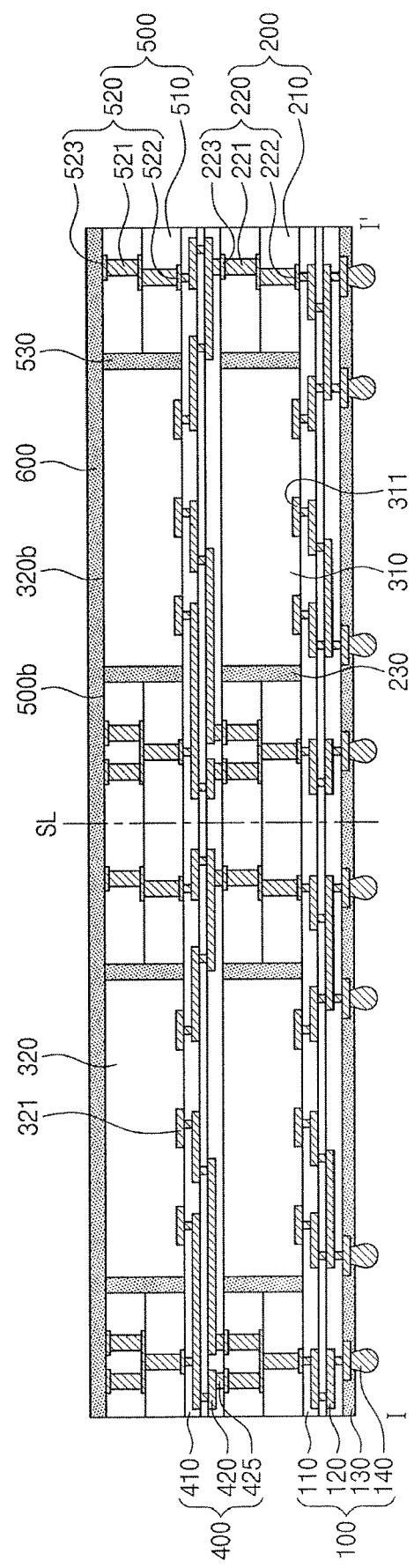

Referring to FIGS. 5 and 6K, the support substrate 920 may be removed. Then a molding layer 600 may be formed on the second substrate 400. For example, a molding member may be coated on the second interconnect substrate 500 and the second semiconductor chip 320 and then cured to form the molding layer 600. The molding member may include, for example, an ABF, an insulating polymer such as an epoxy-based polymer, or a high molecular material such as a thermosetting resin. The molding member may be cured, for example, by heat treatment at a temperature more than about 180° C. The molding layer 600 may cover the top surface 500*b* of the second interconnect substrate 500 and the top surface 320*b* of the second semiconductor chip 320.

Referring again to FIGS. 1 and 5, a sawing process may be performed to dice the first substrate 100, the first interconnect substrate 200, the second substrate 400, and the second interconnect substrate 500 into individual semiconductor packages P100. When the sawing process is performed, the first substrate 100, the first interconnect substrate 200, the second substrate 400, and the second interconnect substrate 500 may be cut along a sawing line SL shown in FIG. 6K.

In accordance with one or more of the aforementioned embodiments, a semiconductor package includes a plurality of stacked semiconductor chips with reduced thickness and therefore decreased size. Accordingly, it may be possible to increase integration of devices each including the semiconductor package.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor package, comprising:
a first redistribution substrate;
a first interconnect substrate on the first redistribution substrate and having a first opening penetrating the first interconnect substrate;
a first semiconductor chip mounted on the first redistribution substrate and in the first opening of the first interconnect substrate, a bottom surface of the first semiconductor chip being an active surface;
a first insulating layer that fills a first gap between the first semiconductor chip and the first interconnect substrate, top surfaces of the first insulating layer and the first interconnect substrate being level with each other;
a second redistribution substrate on the first interconnect substrate and the first semiconductor chip;
a second interconnect substrate on the second redistribution substrate and having a second opening penetrating the second interconnect substrate; and
a second semiconductor chip on the second redistribution substrate and in the second opening of the second interconnect substrate,
wherein the second semiconductor chip is electrically connected to the first interconnect substrate through a conductive pattern of the second redistribution substrate between the first and second semiconductor chips without any bump, and
wherein a distance between a bottom surface of the second semiconductor chip and a top surface of the first semiconductor chip along a direction normal to the top surface of the first semiconductor chip is smaller than a thickness of at least one of the first and second semiconductor chips along the direction normal to the top surface of the first semiconductor chip.

2. The semiconductor package as claimed in claim 1, wherein:
the first interconnect substrate includes:
a first base layer including a material which is different from that in the first insulating layer, and
a first conductive member in the first base layer to connect with the first redistribution substrate and the second redistribution substrate, and
the second interconnect substrate includes a second base layer and a second conductive member in the second base layer.

3. The semiconductor package as claimed in claim 2, wherein the first and second conductive members are coupled to the second redistribution substrate and are electrically connected to each other.

4. The semiconductor package as claimed in claim 2, wherein the first conductive member includes:
first upper pads embedded in a top surface of the first interconnect substrate;
first lower pads embedded in a bottom surface of the first interconnect substrate; and
first through vias connecting the first lower pads to the first upper pads.

5. The semiconductor package as claimed in claim 1, wherein the first redistribution substrate includes:
first insulating patterns;
a first pad on a bottom surface of the first redistribution substrate; and
a first line pattern between the first insulating patterns and electrically connecting the first semiconductor chip to the first pad,
wherein the second redistribution substrate includes:
second insulating patterns;
a second pad on a bottom surface of the second redistribution substrate; and
a second line pattern between the second insulating patterns and electrically connecting the second semiconductor chip to the second pad, and
wherein the second pad is disposed outside the first semiconductor chip.

6. The semiconductor package as claimed in claim 1, further comprising:
a second insulating layer that fills a second gap between the second semiconductor chip and the second interconnect substrate.

7. The semiconductor package as claimed in claim 1, further comprising:
a glue layer between the second redistribution substrate and the first semiconductor chip.

8. The semiconductor package as claimed in claim 1, further comprising:
a third redistribution substrate on the second interconnect substrate and the second semiconductor chip;
a third interconnect substrate on the third redistribution substrate and having a third opening penetrating the third interconnect substrate; and
a third semiconductor chip on the third redistribution substrate and in the third opening of the third interconnect substrate, wherein the third semiconductor chip is electrically connected through the third redistribution substrate to the second interconnect substrate.

9. The semiconductor package as claimed in claim 1, wherein:

the bottom surface of the first semiconductor chip and a bottom surface of the first interconnect substrate are in contact with a top surface of the first redistribution substrate, the bottom surface of the first semiconductor chip and the bottom surface of the first interconnect substrate are at a same level, the bottom surface of the second semiconductor chip and a bottom surface of the second interconnect substrate are in contact with a top surface of the second redistribution substrate, and the bottom surface of the second semiconductor chip and the bottom surface of the second interconnect substrate are at a same level.

10. The semiconductor package as claimed in claim 1, wherein the second redistribution substrate is in contact with a top surface of the first interconnect substrate and a bottom surface of the second interconnect substrate.

11. The semiconductor package as claimed in claim 1, further comprising:
   an interconnect terminal between the first interconnect substrate and a bottom surface of the second redistribution substrate.

12. A semiconductor package, comprising:
   a first substrate;
   a first semiconductor chip mounted on the first substrate, a bottom surface of the first semiconductor chip being an active surface;
   a first interconnect substrate on the first substrate and laterally spaced apart from the first semiconductor chip, the first semiconductor chip surrounded by the first interconnect substrate in a plan view;
   a second substrate electrically connected to the first interconnect substrate and covering the first interconnect substrate and the first semiconductor chip;
   a second semiconductor chip on the second substrate; and
   a second interconnect substrate on the second substrate and laterally spaced apart from the second semiconductor chip, the second semiconductor chip surrounded by the second interconnect substrate, in a plan view, wherein each of the first and second interconnect substrates comprises a base layer and a conductive member in the base layer, wherein the second semiconductor chip is electrically connected to the first interconnect substrate through a conductive pattern of the second substrate between the first and second semiconductor chips without any bump, wherein a first insulating layer fills a first gap between the first semiconductor chip and the first interconnect substrate, top surfaces of the first insulating layer and the first interconnect substrate being level with each other, and wherein a distance between a bottom surface of the second semiconductor chip and the top surface of the first semiconductor chip along a direction normal to the top surface of the first semiconductor chip is smaller than a thickness of at least one of the first and second semiconductor chips along the direction normal to the top surface of the first semiconductor chip.

13. The semiconductor package as claimed in claim 12, further comprising:
   a second insulating layer between the second semiconductor chip and the second interconnect substrate.

14. The semiconductor package as claimed in claim 12, wherein:
   the first interconnect substrate includes a first opening penetrating therethrough,
   the first semiconductor chip is in the first opening,
   the second interconnect substrate includes a second opening penetrating therethrough, and
   the second semiconductor chip is in the second opening.

15. The semiconductor package as claimed in claim 12, further comprising:
   a glue layer between the first semiconductor chip and the second substrate.

16. The semiconductor package as claimed in claim 2, wherein the the second redistribution substrate is coupled to the first and second interconnect substrates without any void space between the first and second interconnect substrates.

* * * * *